United States Patent [19]

English et al.

[11] Patent Number: 4,553,114
[45] Date of Patent: Nov. 12, 1985

[54] ENCAPSULATED PRINTED CIRCUIT BOARD FILTER

[75] Inventors: James M. English, Coplay; Nicholas L. Gurreri, York; John P. Kling, Mt. Joy, all of Pa.

[73] Assignee: AMP Incorporated, Harrisburg, Pa.

[21] Appl. No.: 527,041

[22] Filed: Aug. 29, 1983

[51] Int. Cl.[4] .......................... H03H 7/01; H05K 1/16
[52] U.S. Cl. ...................................... 333/182; 333/12; 333/185; 361/400
[58] Field of Search ............................... 333/167-185, 333/12; 361/302, 303, 308, 310; 174/68.5; 361/400, 401, 404, 409

[56] References Cited

U.S. PATENT DOCUMENTS

Re. 29,258  6/1977  Fritz ..................................... 333/182
3,053,237  5/1962  Schlicke ............................ 361/302 X
3,293,514  12/1966  Podolsky et al. ................... 361/306
3,743,978  7/1973  Fritz ..................................... 333/182
3,939,444  2/1976  Hollyday et al. .
3,991,347  11/1976  Hollyday ........................... 174/68.5
4,320,364  3/1982  Sakamoto et al. ................. 333/167

Primary Examiner—Marvin L. Nussbaum
Attorney, Agent, or Firm—Katherine A. Nelson; Russell J. Egan

[57] ABSTRACT

A RF-EMI filter for circuit boards is formed by a through pin terminal having a filter sleeve mounted thereon and a ground pin with an eyelet portion formed about the filter sleeve with a leg depending normal to the axis of the sleeve. The ends of the through pin are formed parallel to each other and to the ground pin leg. The filter sleeve, and its immediate environment, are encapsulated in an insulative material. The thus formed three legged filter can be applied to a circuit board along with the other components to be fixed thereto.

8 Claims, 6 Drawing Figures

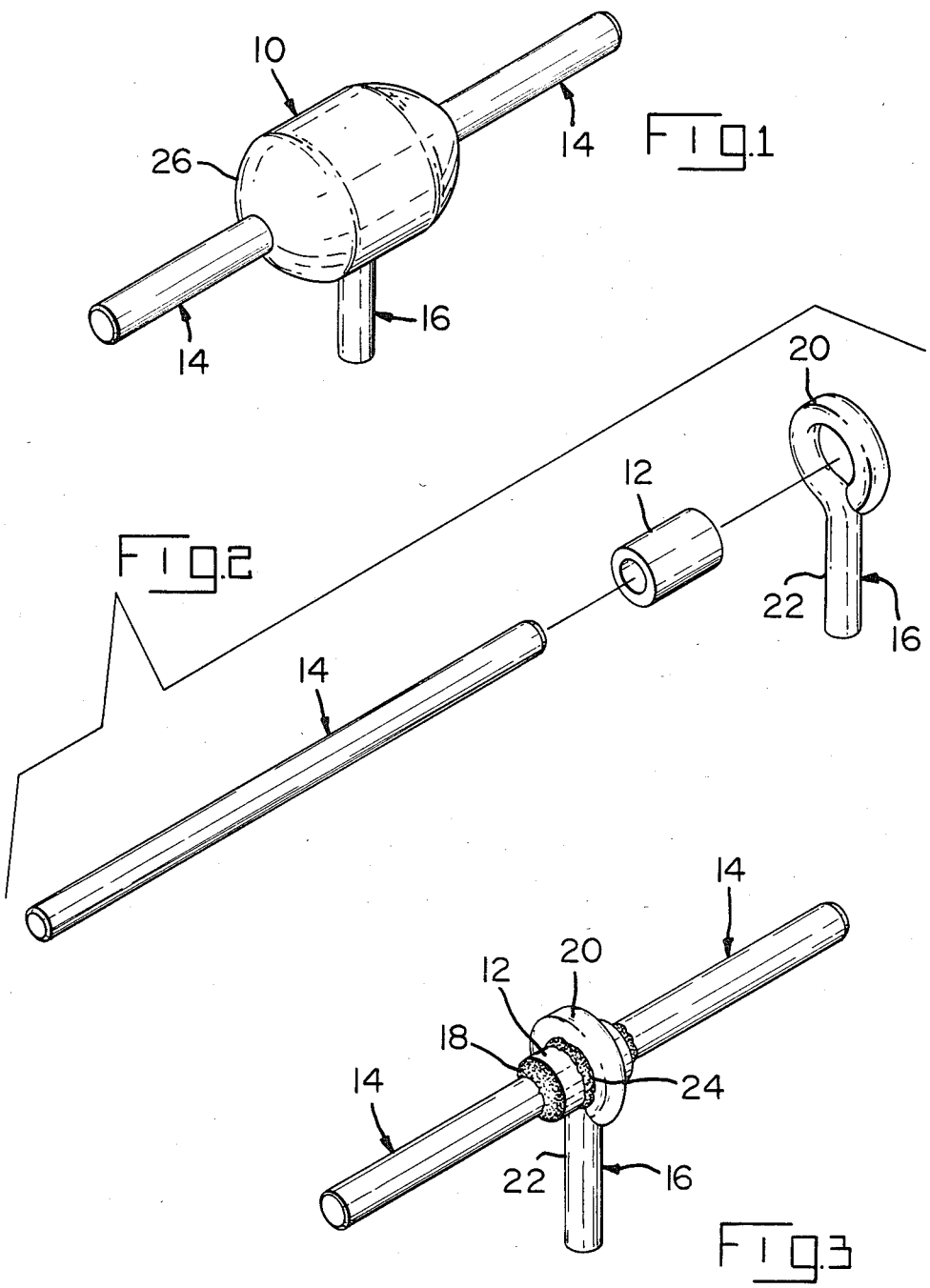

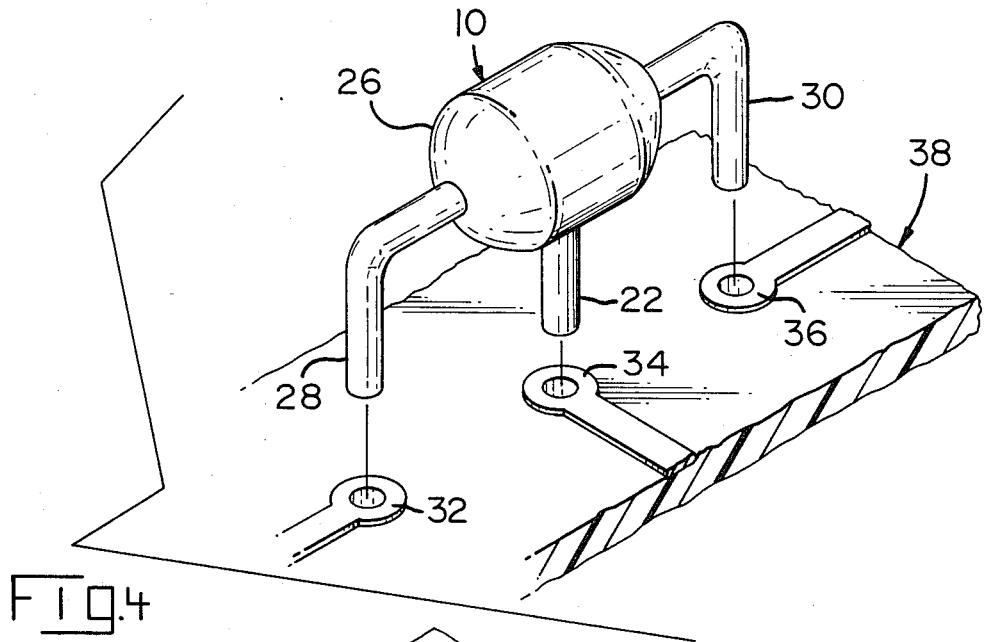
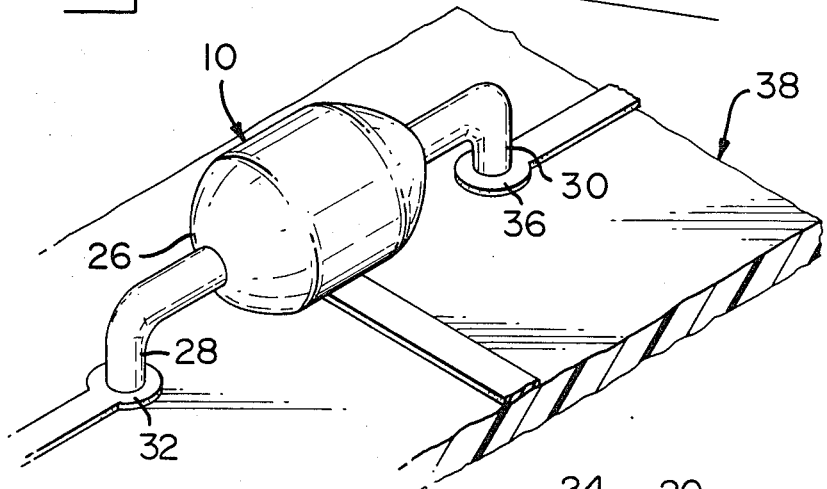
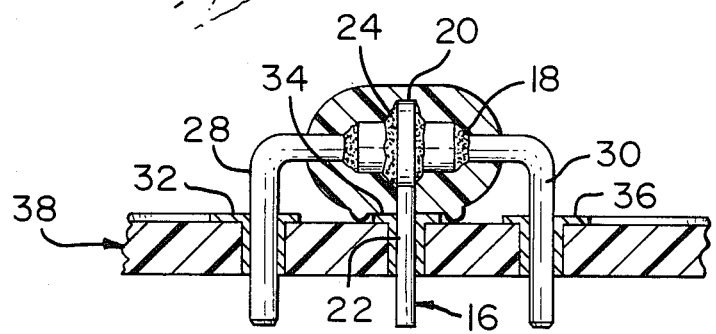

ENCAPSULATED PRINTED CIRCUIT BOARD FILTER

The present invention relates to a device to provide effective EMI filtering on a circuit board and in particular to a filter device which can be readily attached to the circuit board.

The use of electronic filter devices to remove radio frequency and electromagnetic interference is well known. Many of the these devices are formed as ceramic tubular sleeves having conductive layers plated on the inner and outer surfaces thereof. In most instances these filters then have a pin terminal secured to the inner surface and the filter pin assembly is then secured by its outer surface in an aperture of an infinite ground plane. This, of couse, is not possible when it is desired to mount the filter device onto a circuit board or the like.

Previous attempts to provide filtering on circuit boards are described in U.S. Pat. Nos. 3,939,444 and 3,991,347. While both of these devices did serve to accomplish the desired filtering they were somewhat cumbersome in structure and application.

It is the intention of the present invention to overcome the disadvantages of the prior art by providing a circuit board mountable filtering device which can be readly and economically produced and assembled on the circuit board.

The subject filter is a three legged device having a through conductor with a filter sleeve mounted centrally thereon and the ends thereof angled to form mounting legs. A ground pin has an eyelet portion formed to receive the cylindrical filter therein and a leg portion to depend between the mounting legs of the through conductor. The entire assembly of conductor, filter sleeve and ground pin is encapsulated in a thermal plastic or other suitable insulative body which body also provides stand-off for the filter.

The subject three legged filter device can be readily mounted on a circuit board with the legs thereof received in appropriate apertures and engaging respective circuitry. The filter can be applied with all of the other components of the circuit board, such as resistors and capacitors, and secured thereto by a known technique, such as wave soldering.

The present invention will now be described by way of example with reference to the accompanying drawings in which:

FIG. 1 is a perspective view of a three legged filter according to the present invention;

FIG. 2 is an exploded perspective view of the through conductor filter sleeve and ground pin of the present invention;

FIG. 3 is a perspective view of the assembled through conductor, ground pin, and the filter sleeve of the present invention;

FIG. 4 is a perspective view of the subject invention exploded above a circuit board;

FIG. 5 is a perspective view similar to FIG. 4 showing the subject invention fully mounted on a circuit board; and FIG. 6 is a side elevation, partially in section, of a three legged filter according to the present invention.

The subject three legged filter assembly 10 is comprised of a filter sleeve 12, a through conductor 14, and a ground pin 16. The filter sleeve is of a known type having a tubular ceramic body plated on the inner and outer surfaces with a conductive material and disclosed in U.S. Pat. No. 3,743,978 which is also U.S. Pat. No. Re. 29,258, the disclosures of which are incorporated herein by reference. The through conductor is simply a solid pin of conductive material while the ground pin is a formed member having an eyelet 20 and a leg portion 22.

The subject invention is assembled by applying the filter sleeve 12 to the through conductor 14 and soldering them together with solder 18 in known fashion. The eyelet portion 20 of the ground pin is applied around the exterior of the filter sleeve 12 and secured thereto by solder 24. The entire assembly of through conductor 14, filter sleeve 12 and ground pin 16, as shown in FIG. 3, is then encapsulated in a thermoplastic or other insulative molded body 26 to arrive at substantially the configuration of FIG. 1. The ends of the through conductor 14 are bent parallel to each other and to the leg portion 22 of the ground pin to form the three legged assembly shown in FIG. 4. Obviously the spacing between the legs 28, 30 will be chosen to be received in the appropriate apertures 32, 34, 36 of the circuit board 38.

The advantages of the present invention include the fact that it is directly mountable on a circuit board without the need for separate mounting brackets or ground planes. The ground pin and mounting legs can be formed to facilitate almost any spaacing necessary for mounting on a circuit board. Environmental protection is provided for the filter sleeve by the encapsulation 26 which also serves as a stand-off, as can best be appreciated from FIG. 6, to ease solder flux removal. The three legged filter of the present invention can be soldered onto the circuit board along with other components in a conventional assembly technique.

We claim:

1. A filter assembly for providing RF/EMI filtering on a circuit board comprising:
    a cylindrical filter element having a bore therethrough;
    a conductive pin extending through the bore of said filter element and secured in electrical and mechanical engagement with the inner surface thereof, said conductive pin having end portions which extend outwardly from said bore said conductive pin end portions arranged so as to electrically engage respective conductive paths on said circuit board; and
    a ground pin having a first leg portion disposed about and substantially encircling the exterior surface of said filter element and in electrical and mechanical engagement therewith, and a second leg portion which extends outwardly from said first end and in electrical engagement with another respective conductive path on said circuit board.

2. The filter assembly according to claim 1 wherein said filter element is encapsulated with insulating means and said conductive end portions and said ground leg portions extend outwardly from said encapsulated filter element.

3. The filter assembly according to claim 2 wherein said insulating means encapsulating said filter element further forms a stand-off separating said assembly from said circuit board.

4. The filter assembly according to claim 1 wherein said filter element is a ceramic tubular member with integral inner and outer conductive layers.

5. The filter assembly according to claim 1 wherein said conductive end portions are bent and are parallel to said ground leg.

6. In combination with a circuit board having at least one surface provided with an electrically conductive patterned array with a plurality of through holes in said circuit board intersecting respective portions of said array and receiving therein leads of electrical components completing said circuit, a filter assembly providing RF/EMI filtering for said circuit board and comprising:
- a cylindrical filter sleeve formed by a tubular ceramic member having a bore therein, said member further having conductive layers on its inner and outer surfaces,
- a conductive pin mounted and extending through the bore of said sleeve electrically and mechanically contacting said inner conductive layer, end portions of said pin extending outwardly from said sleeve to define a pair of spaced legs received in respective through holes of said circuit board, and
- a ground pin having one end disposed about and substantially encircling said filter sleeve and in electrical and mechanical engagement with said outer conductive layer of said filter sleeve, and a second integral leg end extending outwardly from said filter sleeve, said leg being received in respective through hole of said circuit board to contact an infinite ground portion of said array on said circuit board.

7. The combination as recited in claim 6 wherein said filter sleeve and its immediate environment are encapsulated with an insulating material.

8. The combination according to claim 7 wherein said insulating material is profiled to form a stand-off for separating said filter assembly from said circuit board.

* * * * *